United States Patent [19]
Dworsky et al.

[11] Patent Number: 5,373,268
[45] Date of Patent: Dec. 13, 1994

[54] THIN FILM RESONATOR HAVING STACKED ACOUSTIC REFLECTING IMPEDANCE MATCHING LAYERS AND METHOD

[75] Inventors: Lawrence N. Dworsky, Scottsdale; Luke C. B. Mang, Phoenix, both of Ariz.

[73] Assignee: Motorola, Inc., Schaumburg, Ill.

[21] Appl. No.: 11,924

[22] Filed: Feb. 1, 1993

[51] Int. Cl.⁵ .............................................. H03H 9/17
[52] U.S. Cl. ................................... 333/187; 310/321
[58] Field of Search .............................. 333/187–192; 310/321, 324, 334

[56] References Cited

U.S. PATENT DOCUMENTS

| | | | |
|---|---|---|---|
| 3,313,959 | 4/1967 | Dill | 307/275 |
| 3,414,832 | 12/1968 | Newell | 330/286 |
| 4,166,967 | 9/1979 | Benes et al. | 310/334 X |
| 4,456,850 | 6/1984 | Inoue et al. | 310/324 |
| 4,460,756 | 2/1987 | Wang et al. | 204/192.18 |
| 4,502,932 | 3/1985 | Kline et al. | 204/192 EC |
| 4,556,812 | 12/1985 | Kline et al. | 310/324 |
| 4,616,152 | 10/1986 | Saito et al. | 310/334 |
| 4,642,508 | 2/1987 | Suzuki et al. | 310/321 |
| 4,672,591 | 6/1987 | Breimesser et al. | 310/334 |
| 4,719,383 | 1/1988 | Wang et al. | 310/324 |
| 4,749,900 | 6/1988 | Hadimioglu et al. | 310/334 |
| 5,011,568 | 4/1991 | Brayman et al. | 156/647 |
| 5,075,641 | 12/1991 | Weber et al. | 331/108 C |
| 5,162,691 | 11/1992 | Mariani et al. | 310/321 |

FOREIGN PATENT DOCUMENTS 137319  8/1983  Japan ................................. 310/324

OTHER PUBLICATIONS

"Face-Mounted Piezoelectric Resonators", W. E. Newell, Proceedings of the IEEE, pp. 575-581, Jun. 1965.

Primary Examiner—Benny Lee
Attorney, Agent, or Firm—Eugene A. Parsons; Frederick M. Fliegel

[57] ABSTRACT

A frequency selective component and a method for making a frequency selective component. The frequency selective component includes a substrate having at least a first surface and an acoustic impedance transformer coupled to the substrate. The acoustic impedance transformer transforms an acoustic impedance of the substrate to a second acoustic impedance. The acoustic resonator further includes a mechanical resonator disposed on the acoustic impedance transformer. The acoustic resonator provides a frequency selection function.

17 Claims, 4 Drawing Sheets

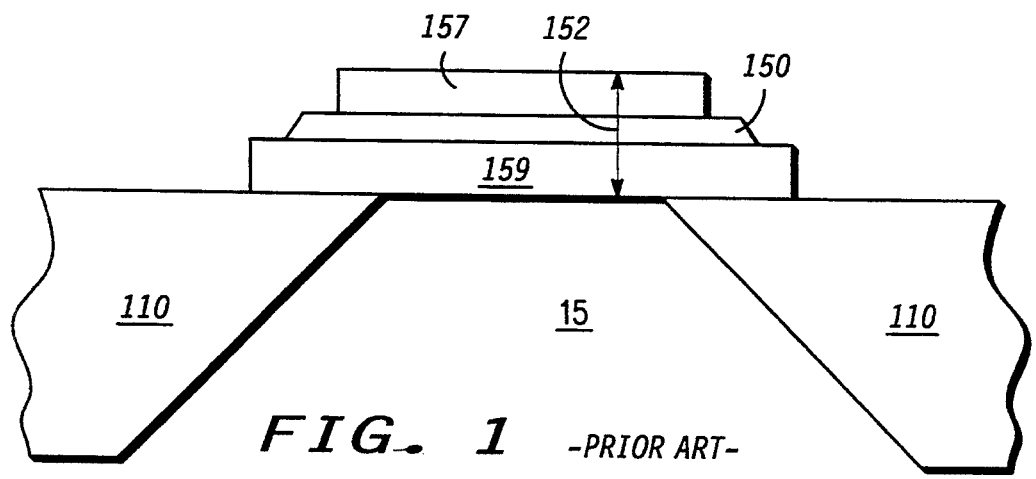
FIG. 1  -PRIOR ART-
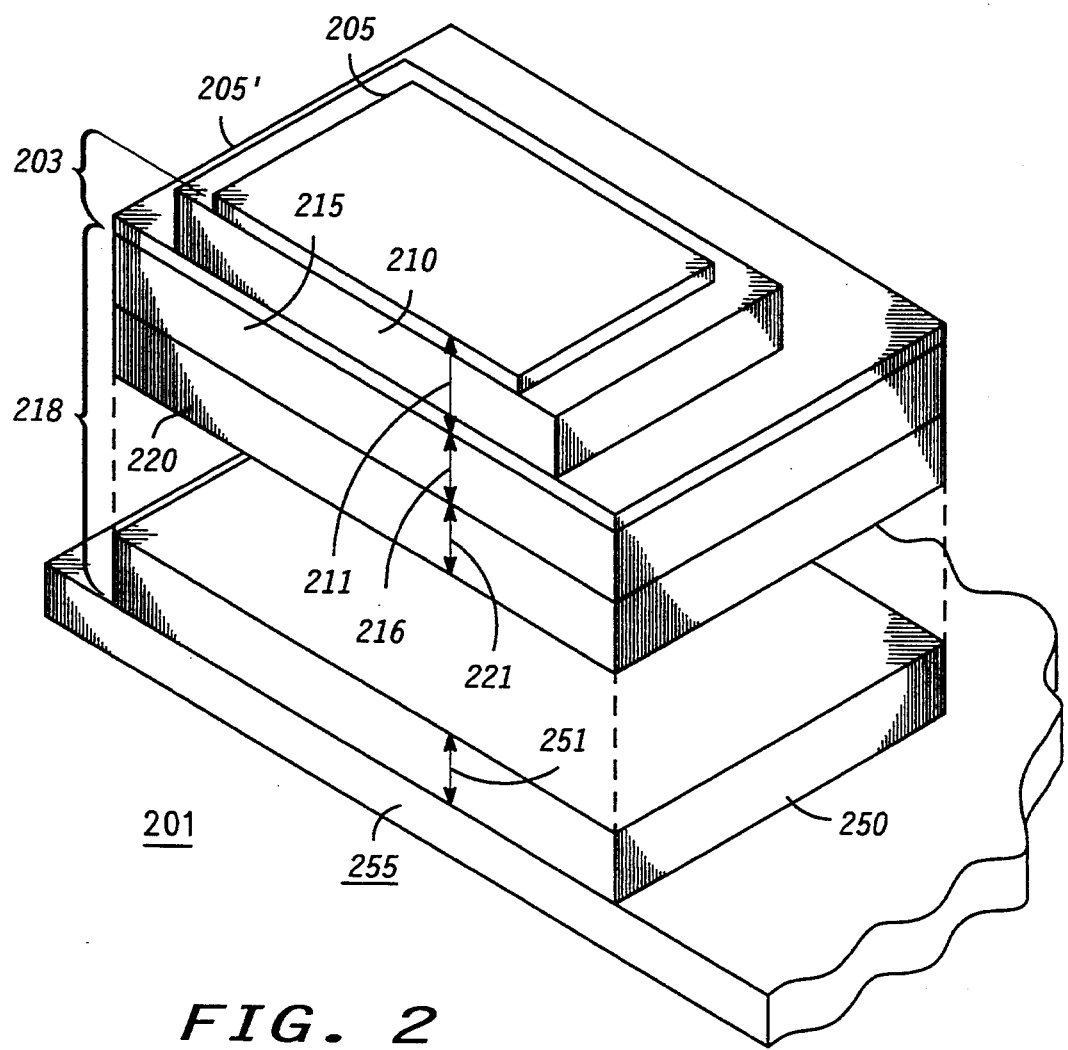
FIG. 2

THIN FILM RESONATOR HAVING STACKED ACOUSTIC REFLECTING IMPEDANCE MATCHING LAYERS AND METHOD

CROSS-REFERENCE TO RELATED APPLICATIONS

This application is related to co-pending U.S. patent application Ser. No. 827,311, filed on Jan. 29, 1992, now U.S. Pat. No. 5,294,898, issued Mar. 15, 1994 which is assigned to the same assignee as the present application.

FIELD OF THE INVENTION

This invention relates in general to the field of microfabricated frequency selection components, in particular to acoustic frequency selection devices and more particularly to thin-film acoustic resonator devices.

BACKGROUND OF THE INVENTION

Frequency selective components are important for many electronic products requiring stable frequency signals or ability to discriminate between signals based on frequency diversity. These functions are difficult to reliably and repeatably realize in monolithic form together with other microelectronic components such as transistors, diodes and the like.

One approach to realizing frequency selective functions employs a mass allowed to vibrate in one or more dimensions (e.g., a pendulum). Such a mass is conveniently realized as a thin film supported at critical points, for example, peripherally or alternatively along one edge or end, forming a thin film resonator structure. Such structures provide clearly defined mechanical resonances having significant utility, for example, as filters and as frequency stabilizing feedback elements in oscillator circuits.

A significant drawback of previous thin film resonators has been the need to fabricate a free-standing thin film membrane. Typically, this is effected by forming a sacrificial layer followed by deposition of the thin film membrane. The sacrificial layer is then selectively removed, leaving a self-supporting thin film layer.

Alternatively, a substrate material having a thin film layer disposed thereon is etched from the back side to provide an opening extending up to the bottom of the membrane. This can be accomplished by use of etchants having etch rates sensitive to doping of semiconductor materials coupled with use of a surface layer of material having different doping than the bulk of the material, for example. Other options include employing a surface layer or layers of different composition and/or crystallographic form or orientation to provide a thin film layer following etching or other treatment to selectively remove some of the material immediately therebelow. A variety of such techniques are described in U.S. Pat. No. 4,556,812, G. R. Kline et al., "Acoustic Resonator With Al Electrodes On An AlN Layer And Using a GaAS Substrate" (Dec. 3, 1985); U.S. Pat. No. 3,313,959, J. G. Dill, "Thin-Film Resonance Device" (Apr. 11, 1967); U.S. Pat. No. 4,456,850, T. Inoue et al., "Piezoelectric Composite Thin Film Resonator" (Jun. 26, 1984); U.S. Pat. No. 4,502,932, G. R. Kline et al., "Acoustic Resonator And Method Of Making Same" (Mar. 5, 1985); U.S. Pat. No. 4,460,756, J. S. Wang et al., "Method Of Making A Piezoelectric Shear Wave Resonator" (Feb. 3, 1987); U.S. Pat. No. 4,642,508, H. Suzuki et al., "Piezoelectric Resonating Device" (Feb. 10, 1987); U.S. Pat. No. 4,719,383, J. S. Wang et al., "Piezoelectric Shear Wave Resonator And Method Of Making Same" (Jan. 12, 1988); U.S. Pat. No. 5,011,568, S. D. Brayman et al., "Use Of Sol-Gel Derived Tantalum Oxide As A Protective Coating For Etching Silicon" (Apr. 30, 1991); U.S. Pat. No. 5,075,641, R. J. Weber et al., "High Frequency Oscillator Comprising Thin Film Resonator And Active Device" (Dec. 24, 1991); and U.S. Pat. No. 5,162,691, E. A. Mariani et al., "Cantilevered Air-Gap Type Thin Film Piezoelectric Resonator" (Nov. 10, 1992), which patents are hereby incorporated by reference.

An alternative approach involves forming a cantilevered beam capacitively coupled to adjacent structures (e.g., a conductor placed beneath the beam). The beam is free to vibrate and has one or more resonance frequencies. Disadvantages of these approaches include need to form free-standing structures and also a tendency of the beam to "stick" to adjacent structures if or when the beam comes into contact therewith.

A need to remove any sacrificial layer and/or underlying substrate material limits fabrication ease and results in structures which are extremely fragile with respect to externally applied forces. These factors contribute to reduced fabrication yields and reduced robustness of the finished resonator component.

What are needed are apparatus and methods for forming apparatus wherein the apparatus provides a thin film resonator having solid mechanical support and providing frequency selection characteristics.

SUMMARY OF THE INVENTION

Accordingly, there is provided a new and improved apparatus comprising a substrate having at least a first surface, an acoustic impedance transformer coupled to the substrate and an acoustic resonator atop the acoustic impedance transformer. The acoustic impedance transformer transforms an acoustic impedance of the substrate to a second acoustic impedance. The acoustic resonator provides a frequency selection function.

In a preferred embodiment, the acoustic resonator desirably but not essentially includes a first electrode atop the acoustic impedance transformer, first layer of piezoelectric material atop the first electrode and a second electrode atop the first layer of piezoelectric material. A second layer of piezoelectric material is atop the second electrode and a third electrode is atop the second layer of piezoelectric material. The first, second and third electrodes provide first, second and third electrical contacts, respectively. The first, second and third electrodes and the first and second layers of piezoelectric material have a combined thickness of one-fourth of an acoustic wavelength.

An acoustic reflector is desirably realized including a first layer having a first acoustic impedance and a second layer having a second acoustic impedance greater than the first acoustic impedance. The first and second layers have thicknesses of one-fourth of an acoustic wavelength at a first frequency. The acoustic reflector transforms a low acoustic impedance to a high acoustic impedance.

The present invention further provides a method for making an acoustic resonator. The method involves steps of providing a substrate material having a first acoustic impedance, disposing an acoustic reflector on the substrate material and coupling a piezoelectric resonator one fourth of a first acoustic wavelength thick to the acoustic reflector.

The method desirably but not essentially includes disposing first layers having a second acoustic impedance on the substrate material. The first layers are each one fourth of the first acoustic wavelength in thickness. The method also desirably but not essentially includes disposing second layers having a third acoustic impedance on the substrate material. The second layers are each one fourth of the first acoustic wavelength in thickness. The first and second layers are interleaved. The second and third acoustic impedances are not equal to each other.

The method desirably but not essentially includes steps of coupling a first electrode to the acoustic reflector, coupling a layer of piezoelectric material to the first electrode and coupling a second electrode to the layer of piezoelectric material. The first electrode, the layer of piezoelectric material and the second electrode have a combined thickness of one fourth of the first acoustic wavelength.

In another preferred embodiment, the method desirably but not essentially includes steps of coupling a first electrode to the acoustic reflector, coupling a layer of piezoelectric material to the first electrode, coupling a second electrode to the layer of piezoelectric material, coupling a second piezoelectric layer to the second electrode and coupling a third electrode to the second piezoelectric layer.

BRIEF DESCRIPTION OF THE DRAWING

The invention is pointed out with particularity in the appended claims. However, a more complete understanding of the present invention may be derived by referring to the detailed description and claims when considered in connection with the figures, wherein like reference numbers refer to similar items throughout the figures, and:

FIG. 1 illustrates a simplified side view, in section, of an acoustic resonator in accordance with the prior art;

FIG. 2 is a simplified isometrical view of an acoustic resonator in accordance with the present invention;

DETAILED DESCRIPTION OF THE DRAWING

Figure 3:
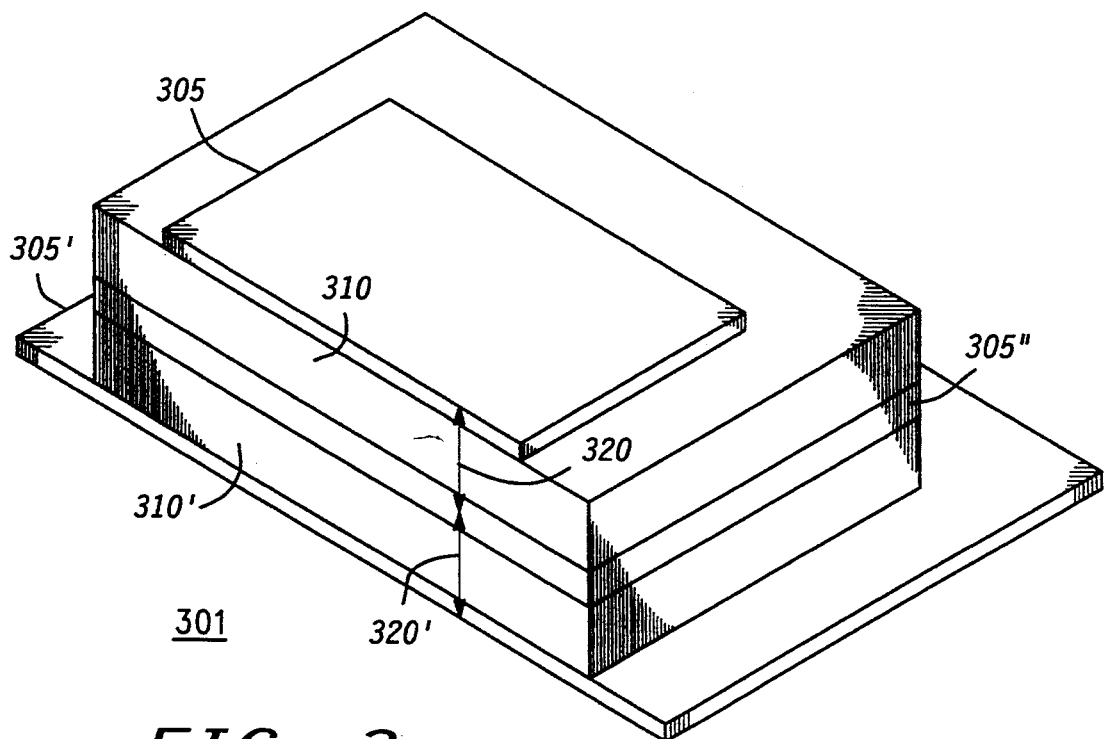
FIG. 3 is a simplified isometric view of an acoustic resonator in accordance with a first preferred embodiment of the present invention.

FIG. 1 illustrates a simplified side view, in section, of acoustic resonator 15 comprising substrate 110 and piezoelectric layer 150 having electrodes 157 and 159 and thickness 152. Thickness 152 is typically chosen to be one-half of an acoustic wavelength or an odd multiple thereof.

Substrate 110 provides mechanical support for piezoelectric layer 150 and electrodes 157 and 159 and for any ancillary components such as transistors, diodes, capacitors, resistors and the like included as part of a larger microelectronic device (not shown). Substrate 110 conveniently comprises semiconductor material(s) or is compatible therewith (e.g., silicon on sapphire, cadmium sulphide on glass, etc.). Semiconductor materials presently of particular interest include elemental semiconductors such as diamond, silicon, germanium, III–V materials such as gallium arsenide, aluminum nitride, indium phosphide and the like, II–VI materials such as cadmium sulphide, zinc oxide and so forth and alloys such as, by way of example and not intended to be limiting, $Si_xGe_{1-x}$, $Al_xGa_{1-x}As$ and $In_xAl_{1-x}P$. Cubic semiconductors (e.g., Si, Ge, GaAs, etc.) are often prepared as wafers having a {100} surface, for example, polished and otherwise prepared for use as semiconductor device substrates. Other useful orientations include {110} and {111} faces.

Semiconductor substrates are often prepared several degrees "misoriented" in order to avoid problems associated with semiconductor device manufacturing processes. Depending on the specific details of resonator construction, this may require consideration in the detailed design of an acoustic resonator to be fabricated thereon.

Acoustic impedance $Z_a$ varies with mass density $\rho$ and stiffness c as $$Z_a = (\rho * c)^{0.5}, \qquad (1)$$

while acoustic velocity $v_a$ varies as $$v_a = (c/\rho)^{0.5}. \qquad (2)$$

One component of acoustic reflection coefficient $\Gamma_Z$ arises from acoustic impedance mismatch (at an interface between different media, for example) and is found analogously to the familiar impedance mismatch reflection coefficient formula $$\Gamma_Z = (Z_t - Z_o)/(Z_o + Z_t), \qquad (3)$$

where $Z_t$ represents a terminating impedance and $Z_o$ represents a characteristic impedance of a transmitting medium. A free surface thus corresponds to an extremely low impedance and provides a reflection coefficient of $-1$ while a surface having infinite density and/or stiffness provides a reflection coefficient of $+1$. A free surface allows particle motion whilst a high impedance surface "clamps" particle motion. Examples of high impedance terminations thus comprise stiff, dense materials (e.g., tungsten) while low impedance terminations are materials having low stiffness and low mass density (e.g., silicone rubber, air).

FIG. 2 is a simplified isometric view of acoustic resonator 201 in accordance with the present invention. Acoustic resonator 201 includes quarter-wavelength resonator 203 disposed atop acoustic reflector 218, which, in turn, is disposed atop substrate 255.

Quarter wavelength resonator 203 comprises electrodes 205, 205' on either side of piezoelectric layer 210. Electrodes 205, 205' and piezoelectric layer 210 have thickness 211 and are atop acoustic reflector 218.

Acoustic reflector 218 comprises a plurality of layers of material, represented here as layer 215 having thickness 216, layer 220 having thickness 221 and layer 250 having thickness 251. Further layers disposed between layers 220, 250 are denoted by ellipsis. Layer 250 is disposed on substrate 255, analogous to substrate 110 (FIG. 1).

Layers 215, 220 . . . 250 of acoustic reflector 218 are chosen to each have thicknesses 216, 221 . . . 251 equal to one-fourth of an acoustic wavelength and are also chosen to have different acoustic impedances, such that in a preferred embodiment acoustic reflector 218 comprises alternating layers of high and low acoustic impedance materials (e.g., layer 250 having higher acoustic impedance than substrate 255). Acoustic reflector 218 thus manifests the Ferranti effect, whereby a low impedance (that of substrate 255, for example) at a first end of a transmission line such as acoustic reflector 218 is transformed to a high impedance at a second end (adjacent electrode 205', for example) when acoustic reflector 218 consists of an odd number of layers 215, 220 . . . 250. This is exemplarily discussed in an article entitled "Face-Mounted Piezoelectric Resonators", by W. E. Newell, Proceedings of the IEEE, pp. 575 through 581, June 1965, which is hereby incorporated herein by reference.

Applicants have discovered that acoustic reflector 218 may be usefully employed to present a high impedance, analogous to a clamped surface, when acoustic reflector 218 is situated atop a material (e.g., substrate 255) having a low acoustic impedance and when acoustic reflector 218 comprises an odd number of layers each one-fourth of an acoustic wavelength in thickness. The effective impedance which acoustic reflector 218 presents increases when the first, third, fifth, etc. layers (e.g., layers 250, 215) have high acoustic impedance and the second, fourth, sixth, etc. layers (e.g., layer 220) have low acoustic impedance.

While acoustic reflector 218 is represented in FIG. 2 as comprising a series of One-fourth wavelength sections, it will be appreciated by those having skill in the relevant arts that impedance transformation may be realized through a number of different techniques, such as, by way of example and not intended to be limiting, tapered impedance media (exponentially/hyperbolically/otherwise tailored impedance profiles may be usefully employed, for example) optimized to provide high impedance or reduced length (thickness) to effect a given impedance transformation, etc. as is known and in accordance with principles discussed, for example, in Chapter 11 and references of *Modern Transmission Line Theory and Applications* by L. N. Dworsky (John Wiley and Sons: N.Y., N.Y., 1979). Tapering of acoustic impedance may be effected, for example, by varying the composition of acoustic reflector 218 from an end closest to substrate 255 to an end closest to resonator 203. Such variation of composition is usefully realized by sequentially sputtering from a plurality of targets and varying dwell time on each target, or by depositing thin layers of material and varying the number of sequential layers of each material, or by any number of other techniques known in the arts.

Applicants have further discovered that when acoustic reflector 218 provides a high acoustic impedance at one end thereof, an acoustic resonator disposed at that one end and comprising electrodes 205', 205 and piezoelectric material 210 may usefully be one-fourth of an acoustic wavelength in thickness. This is possible because a lower surface of the acoustic resonator is clamped.

FIG. 3 is a simplified isometric view of acoustic resonator 301 in accordance with a first preferred embodiment of the present invention. Acoustic resonator 301 is analogous to acoustic resonator 203 (FIG. 2) and comprises electrodes 305, 305" on either side of piezoelectric layer 310 and further comprises electrodes 305", 305' on either side of piezoelectric layer 310'. Piezoelectric layers 310, 310' have thicknesses 320, 320', respectively, wherein thicknesses 320, 320' include thicknesses of electrodes 305, 305', 305". Thicknesses 320, 320' total a thickness of one-fourth of an acoustic wavelength in a first preferred embodiment of the present invention. Electrode 305' corresponds to electrode 205' (FIG. 2) and is disposed atop an acoustic reflector such as 218 (FIG. 2), for example, in a first preferred embodiment of the present invention.

Piezoelectric layers 310, 310' (FIG. 3) and 210 (FIG. 2) desirably comprise piezoelectric (or electrostrictive) materials having acceptable electromechanical coupling coefficients, such as, for example, AlN, ZnO, CdS and the like. Electrodes 305, 305', 305" (FIG. 3) and 205, 205' (FIG. 2) are desirably composed of thin layers of metallic materials having low acoustic losses and favorable electrical conductivity properties (e.g., aluminum or aluminum alloys). Reflector 218 (FIG. 2) desirably comprises layers of materials having low acoustic propagation losses such as glasses, etc. Reflector 218 is conveniently realized as layers of metals because such an arrangement facilitates contacting electrode 205' (FIG. 2) or 305' (FIG. 3), for example, and because metal films are conveniently fabricated and patterned in modern microfabrication facilities. Longitudinal acoustic properties of a few representative materials are summarized in Table I below; comparable shear properties are employed to model resonators using shear vibrational modes. In Table I, stiffness $C_{33}$ is divided by $10^{11}$ and is given in $(N/m^2)$, density $\rho$ is given in kilograms/$m^3$, longitudinal wave acoustic velocity $V_a$ is given in meters/second and acoustic impedance per unit area $Z_o/A$ is given in $(Watts/m^2/(m/s)^2)$ divided by $10^7$.

TABLE I

| Acoustic properties of representative materials. | | | | |
|---|---|---|---|---|
| Material | $C_{33}$ | $\rho$ | $V_a$ | $Z_{o/A}$ |
| ZnO | 2.31 | 5670 | 6388 | 3.62 |
| SiO2 | 0.79 | 2200 | 5973 | 1.31 |
| GaAs | 1.12 | 5300 | 4597 | 2.44 |
| Al | 1.11 | 2700 | 6300 | 1.72 |
| W | 5.81 | 18400 | 5450 | 10.1 |

Parameters for additional materials are given in a variety of sources such as Air Force Cambridge Research Laboratories Report AFCRL-TR-73-0597, entitled *Microwave Acoustics Handbook: Volume 1A, Surface Wave Velocities*, by A. Slobodnik et al. and related volumes, which are available from NTIS and/or DTIC, among other places. Further information is also found in *Principles of Acoustic Devices*, by V. Ristic and in *Acoustic Fields and Waves in Solids*, Vols. I and II, by B. Auld.

Electrodes 305, 305', 305" (FIG . 3) provide electrical connections to acoustic resonator 301. For example, electrodes 305, 305" may comprise an input electrical port having an associated motional capacitance $C_{m1}$ while electrodes 305", 305' may comprise an output electrical port having an associated motional capacitance $C_{m2}$. Motional capacitance $C_m$ is related to static capacitance $C_o$ through the electromechanical coupling coefficient $K^2$, i.e., $C_m/C_o = 8K^2/\pi^2$. Further details describing modelling of acoustic resonators are found in *Introduction to Quartz Crystal Unit Design*, by V. E. Bottom (Van Nostrand Rheinhold Company: New York, 1982).

Figure 4:
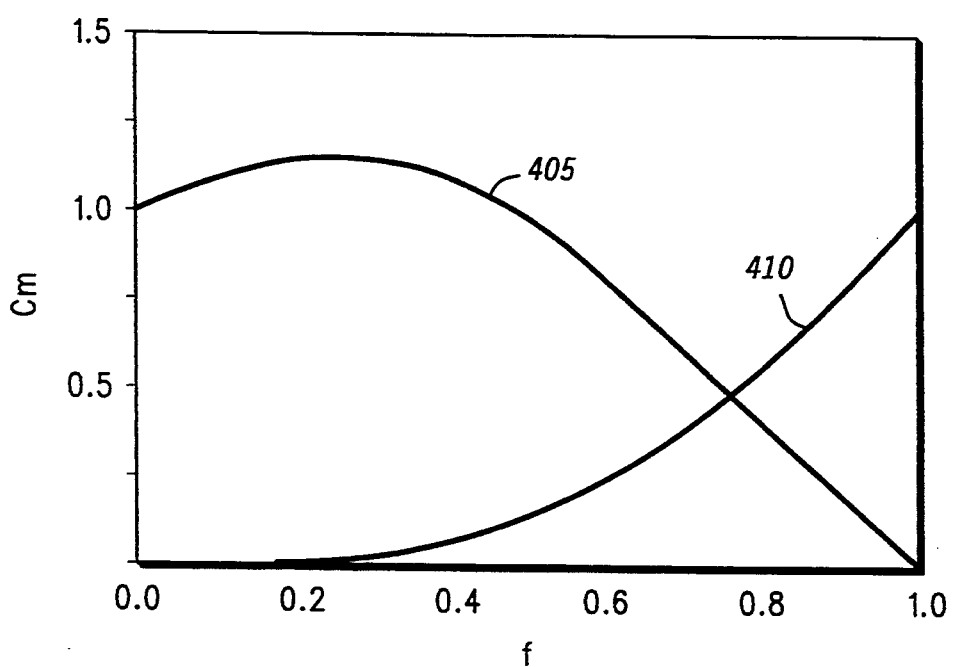
FIG. 4 is a graph illustrating relative motional capacitance for first and second portions of the resonator structure of FIG. 3 in accordance with the first preferred embodiment of the present invention.

FIG. 4 is a graph illustrating relative relative motional capacitances ($C_{m1}$, $C_{m2}$) for the first and second portions of resonator structure 301 (FIG. 3) versus the ratio f of thickness of a first resonator element to total resonator thickness in accordance with the first preferred embodiment of the present invention.

In this example, motional capacitance $C_{m1}$ measured between electrodes 305, 305" varies as shown by curve 405 of FIG. 4 versus fraction f of thickness 310 compared to (i.e., divided by)total thickness 310 plus 310', while motional capacitance $C_{m2}$ measured between electrodes 305', 305" varies (versus f) as curve 410 where thickness 310' is one-fourth of a wavelength minus thickness 310.

In a preferred embodiment of the present invention, applicants have discovered that optimal performance results when fraction f is desirably about f≈0.77, rendering $C_{m1} \approx C_{m2}$. Choosing fraction f such that $C_{m1} \neq C_{m2}$ results in need for inductors external to the resonator. Inclusion of inductors and attendant losses often reduces the ratio of energy stored to energy lost (i.e., Q), increasing filter loss and footprint and complicating filter design, construction and use. Fraction f is usefully within about 25% of 0.77, desirably within about 10% of 0.77 and preferably is within about 5% of 0.77, for example.

Figure 5:
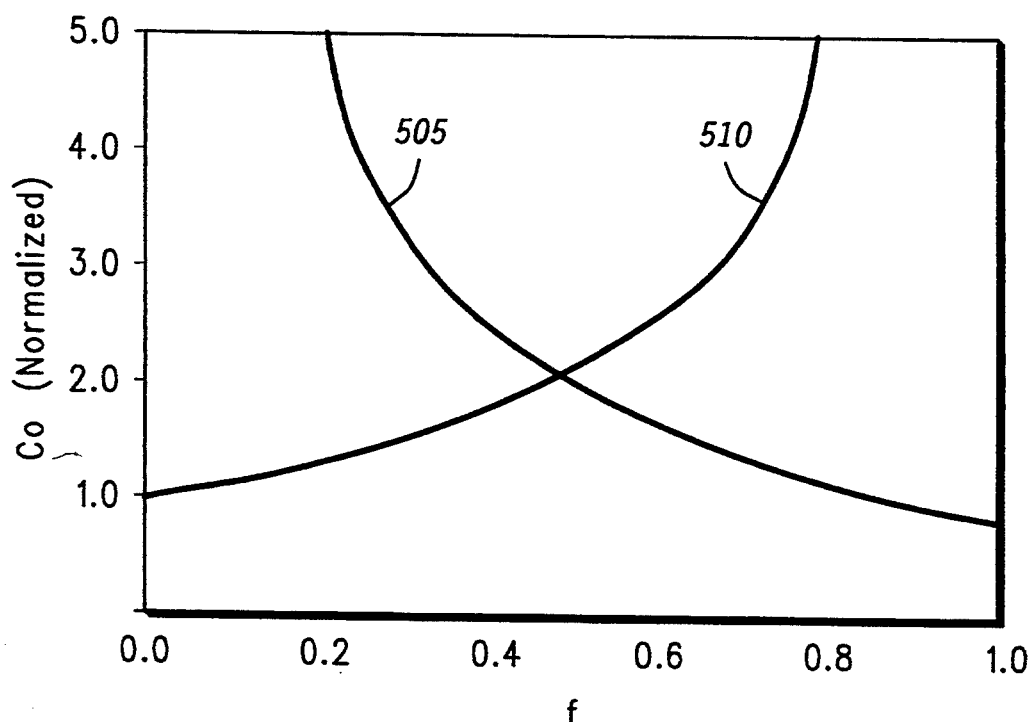
FIG. 5 is a graph illustrating relative static shunt capacitance for first and second portions of the resonator structure of FIG. 3 in accordance with the first preferred embodiment of the present invention.

FIG. 5 is a graph illustrating relative static shunt capacitance for the first and second portions of the resonator structure of FIG. 3 versus fraction f as defined above (FIG. 4) in accordance with the first preferred embodiment of the present invention. In FIG. 5, curve 505 corresponds to curve 405 while curve 510 corresponds to curve 41C. Choosing f≈0.77 provides a capacitance ratio of about 2.5:1. Thus, a filter incorporating cascaded resonators having a topology input-$A_1B_1$-$A_2B_2$-output, wherein A and B, for example, correspond to the input electrical port and output electrical port, respectively, of the above example, and wherein subscripts 1 and 2 correspond to first and second resonators, respectively, will have asymmetric (i.e., different) input and output electrical impedances. In applications wherein it is desired to have similar input and output electrical impedances, a topology such as input-$A_1B_1$-$B_2A_2$-output may be employed, for example.

EXAMPLE

Figure 6:
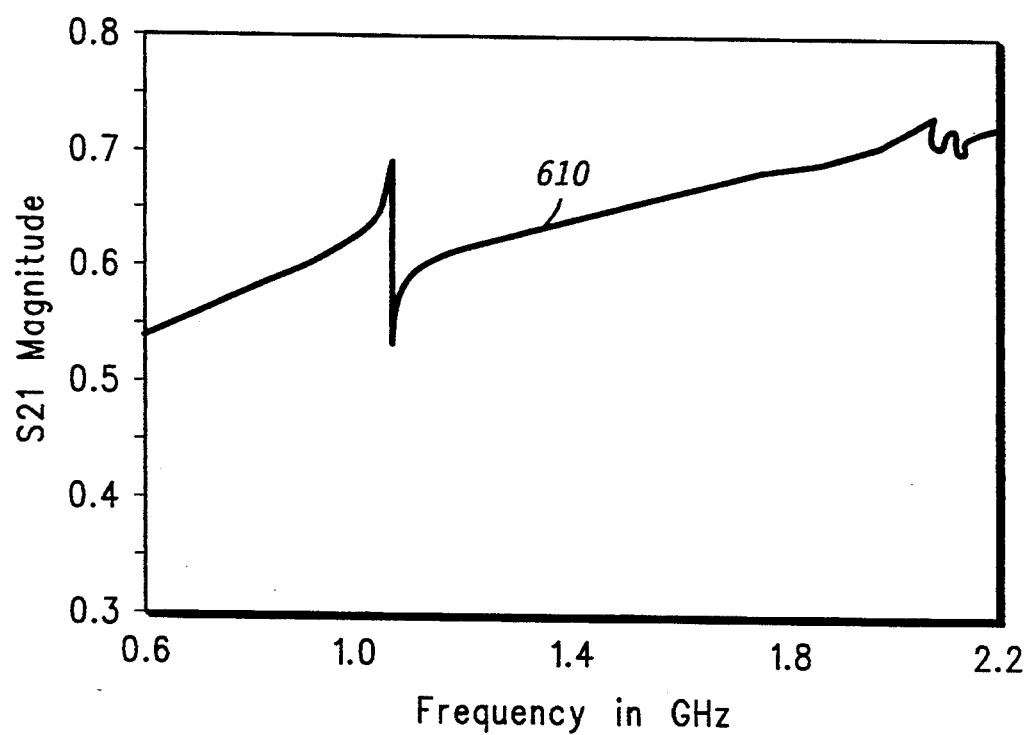
FIG. 6 is a graph of a measured response from an acoustic resonator in accordance with the present invention.

FIG. 6 contains trace 610 describing a measured response taken from an acoustic resonator in accordance with the present invention. The axes of FIG. 6 are calibrated in transmitted signal amplitude (ordinate, 0.5 to 0.8) versus frequency in GigaHertz (abscissa, 0.6 to 2.2 GHz). Trace 610 shows a sharply defined resonance at a frequency of slightly more than one GigaHertz.

Measured response 610 is taken from a resonator in accordance with the structure of FIG. 2, wherein three layers of W (corresponding to layers 250, 215) 0.76 micrometers thick are interleaved with two layers of Al (corresponding to layer 220) 0.88 micrometers thick to form an acoustic reflector (corresponding to acoustic reflector 218) on top of a GaAs substrate (corresponding to substrate 255). W and Al were chosen for these layers because they D provide a substantial acoustic impedance ratio ( see Table I, supra), they facilitate electrical contact and they are convenient for fabrication. A layer of ZnO (corresponding to piezoelectric layer 210) 0.84 micrometer thick was disposed atop the acoustic reflector. The frequency of the resonance shown in trace 610 and the thicknesses given above, coupled with the longitudinal parameters of Table I, suggest that the resonance observed for this structure corresponds to a shear mode rather than a longitudinal mode. A longitudinal mode would be expected to have a resonance frequency circa 1.8 GHz in accordance with the dimensions given above and the physical properties of Table I.

Thin layers (circa 1000 Angstroms) of silicon nitride were deposited by plasma-enhanced chemical vapor deposition above the top W layer and atop the ZnO layer in order to protect them from etchants used to pattern various portions of the experimental resonator structure. For example, the ZnO layer is etched with $HNO_3:HCl:H_2O$ (3:1:4 by volume) which may attack W, Al and/or GaAs, which are protected from such attack by the underlying silicon nitride layer. The W and Al layers are patterned using etchants well known in the microfabrication arts.

Figure 7:
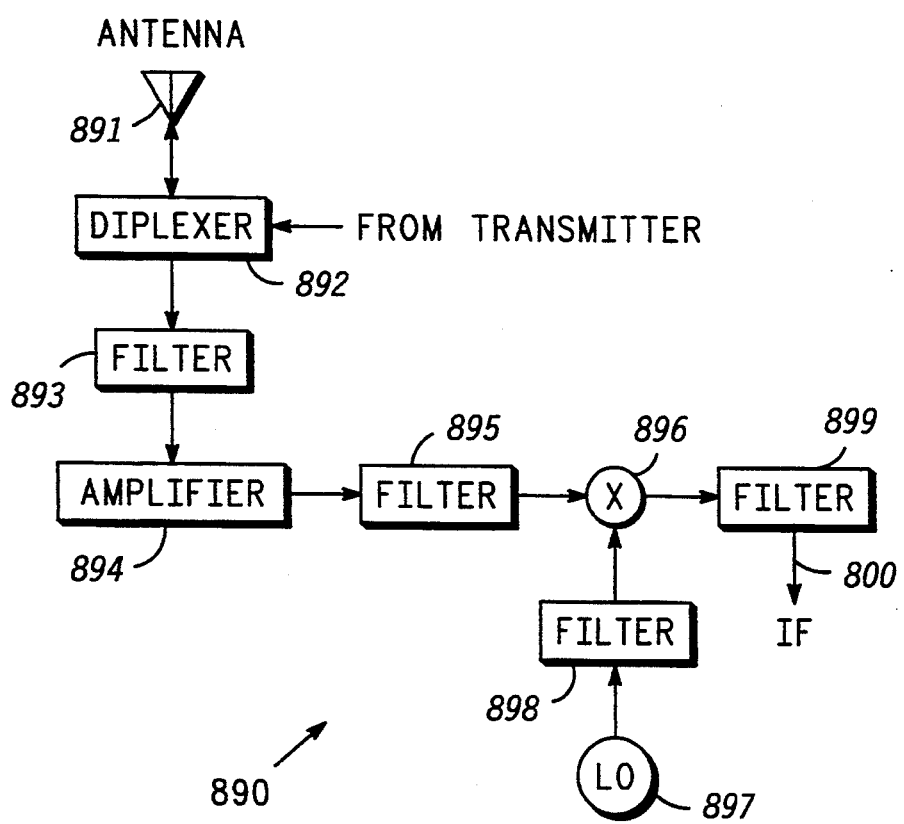
FIG. 7 is a simplified schematic diagram of a portion of a radio frequency apparatus including acoustic wave filters in accordance with the present invention.

FIG. 7 is a simplified schematic diagram indicating how the above-described acoustic filters according to the present invention are advantageously used in radio frequency circuit 890. Radio frequency circuit 890 comprises antenna 891 sending or receiving signals from optional diplexer 892 (which is coupled to the transmitter if one is used). Diplexer 892 sends an incoming signal to filter 893 which passes the resulting band limited signal to amplifier 894. From amplifier 894 the signal passes through another band limiting filter 895 to mixer 896. Mixer 896 also receives a signal from local oscillator 897 through band limiting filter 898. The mixed signal from mixer 896 passes through band limiting filter 899 which removes the local oscillator signal and sends the result to the receiver IF via output 800.

Filters 893, 895, 898 and/or 899 are advantageously thin film resonator filters of the type described here and made according to the structure and method of the present invention, but of varying frequency or other properties according to the particular desired function. For example, filter 893 removes input RF frequencies outside the band in which the receiver is intended to operate. This is particularly useful for narrow band receivers such as are frequently required in cellular phone and paging applications and the like. Additionally, local oscillator 897 may employ a thin film resonator in accordance with the present invention for a frequency stabilizing element.

Filter 895 may have the same or a different pass band than filter 893 and removes any undesired harmonics generated by amplifier 894 ore, other out-of-band signals not removed by filter 893. Filter 898 desirably passes the LO frequency and stops undesired harmonics thereof. Filter 899 desirably passes the sum or difference frequencies produced by mixer 896, and blocks the local oscillator and input RF frequencies. This is important to avoid saturating the input stages of the IF amplifier which is typically coupled to output 800. Thus, electronic apparatus, and especially radios have improved properties as a result of the improved properties of the thin film resonator filters of the present invention.

Thus, a thin film resonator and method have been described which overcome specific problems and accomplishes certain advantages relative to prior art methods and mechanisms. The improvements over known technology are significant. The expense, complexities, large volume and spurious responses of prior art approaches are avoided.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

We claim:

1. A method for making an acoustic resonator, said method comprising steps of:
   (a) providing a substrate material having a first acoustic impedance;
   (b) disposing an acoustic reflector on the substrate material; and
   (c) coupling a piezoelectric resonator having a thickness of one fourth of a first acoustic wavelength to the acoustic reflector.

2. A method as claimed in claim 1, wherein said step (b) comprises substeps of:
   (b1) disposing one of a first and a second acoustic reflecting layer on the substrate material, the first acoustic reflecting layer having a second acoustic impedance, the second acoustic reflecting layer having a third acoustic impedance, the first and second acoustic reflecting layers each having a thickness of one fourth of the first acoustic wavelength; and
   (b2) interleaving additional ones of the first and second acoustic reflecting layers atop said one of a first and second acoustic reflecting layers to form said acoustic reflector.

3. A method as claimed in claim 1, wherein said step (c) comprises substeps of:
   (c1) coupling a first electrode to the acoustic reflector;
   (c2) coupling a first piezoelectric layer to the first electrode; and
   (c3) coupling a second electrode to the first piezoelectric layer.

4. A method as claimed in claim 3, wherein said step (c) further comprises substeps of:
   (c4) coupling a second piezoelectric layer to the second electrode; and
   (c5) coupling a third electrode to the second piezoelectric layer.

5. A method as claimed in claim 1, wherein said step (c) includes substeps of:
   (c1) coupling a first electrode to the acoustic reflector;
   (c2) coupling a layer of piezoelectric material to the first electrode; and
   (c3) coupling a second electrode to the layer of piezoelectric material, the first electrode, the layer of piezoelectric material and the second electrode having a combined thickness of one fourth of the first acoustic wavelength.

6. A method as claimed in claim 1, wherein said step (b) includes disposing interleaved first and second acoustic reflecting layers having second and third acoustic impedances, respectively, to form said acoustic reflector, wherein the second and third acoustic impedances are not equal to each other.

7. A frequency selective component comprising:
   a substrate having a first surface and a first acoustic impedance;
   acoustic impedance transformer means coupled to said substrate;
   acoustic resonator means disposed atop said acoustic impedance transformer means for providing a frequency selection function, wherein said acoustic resonator means comprises an acoustic resonator one fourth of a first acoustic wavelength in thickness; and
   wherein said acoustic impedance transformer means provides a transformation of said first acoustic impedance of said substrate to a second acoustic impedance associated with said acoustic resonator means.

8. A frequency selective component as claimed in claim 7, wherein said acoustic resonator comprises:
   a first electrode disposed atop said acoustic impedance transformer means, said first electrode providing a first electrical contact;
   a first layer of piezoelectric material disposed atop said first electrode;
   a second electrode disposed atop said first layer of piezoelectric material, said second electrode providing a second electrical contact;
   a second layer of piezoelectric material disposed atop said second electrode;
   a third electrode disposed atop said second layer of piezoelectric material, said third electrode providing a third electrical contact; and
   wherein said first, second and third electrodes and said first and second layers of piezoelectric material have a combined thickness of one-fourth of said first acoustic wavelength.

9. A frequency selective component as claimed in claim 8, wherein the second electrode is positioned within the acoustic resonator such that a first motional capacitance realized between said first and second electrodes is approximately equal to a second motional capacitance realized between said second and third electrodes.

10. A frequency selective component as claimed in claim 7, wherein said substrate comprises a III-V material.

11. A frequency selective Component as claimed in claim 7, wherein said substrate comprises silicon.

12. A frequency selective component as claimed in claim 7, wherein said acoustic impedance transformer means comprises:
   first layers having a thickness which is one-fourth of an acoustic wavelength, said first layers having a third acoustic impedance;
   second layers having a thickness which is one-fourth of said acoustic wavelength, said second layers having a fourth acoustic impedance; and
   wherein said first and second layers are alternately disposed to realize said acoustic impedance transformer means and wherein said third and fourth acoustic impedances cooperate to realize transformation of said first acoustic impedance to said second acoustic impedance.

13. A frequency selective component as claimed in claim 12, wherein said second acoustic impedance approaches an acoustic impedance of a clamped surface.

14. A frequency selective component as claimed in claim 7, wherein said substrate comprises a cubic material and said first surface comprises a {100} oriented surface.

15. In a radio frequency apparatus, an acoustic resonator comprising:
   a substrate;
   an acoustic impedance transformer coupled to said substrate;
   an acoustic resonator disposed atop said acoustic impedance transformer, said acoustic resonator having a thickness of one fourth of an acoustic wavelength, said acoustic resonator providing a frequency selection function; and
   wherein said acoustic impedance transformer provides a transformation of an acoustic impedance associated with said substrate to a second acoustic impedance associated with said acoustic resonator.

16. A radio frequency apparatus as claimed in claim 15, wherein said acoustic resonator comprises:
   a first electrode disposed atop said acoustic impedance transformer and providing a first electrical contact;
   a first layer of piezoelectric material disposed atop said first electrode;
   a second electrode disposed atop said first layer of piezoelectric material and providing a second electrical contact; and
   said first and second electrodes and said first layer of piezoelectric material having a combined thickness of one-fourth of said acoustic wavelength.

17. A radio frequency apparatus as claimed in claim 15, wherein said acoustic resonator comprises:
   a first electrode disposed atop said acoustic impedance transformer and providing a first electrical contact;
   a first layer of piezoelectric material disposed atop said first electrode;
   a second electrode disposed atop said first layer of piezoelectric material and providing a second electrical contact;
   a second layer of piezoelectric material disposed atop said second electrode;
   a third electrode disposed atop said second layer of piezoelectric material and providing a third electrical contact; and
   said first, second and third electrodes and said first and second layers of piezoelectric material having a combined thickness of one-fourth of said acoustic wavelength.

* * * * *